US011605525B2

(12) United States Patent
Vickers et al.

(10) Patent No.: US 11,605,525 B2
(45) Date of Patent: Mar. 14, 2023

(54) SYSTEM AND METHOD OF PREPARING INTEGRATED CIRCUITS FOR BACKSIDE PROBING USING CHARGED PARTICLE BEAMS

(71) Applicant: FEI Company, Hillsboro, OR (US)

(72) Inventors: James Vickers, San Jose, CA (US); Seema Somani, San Jose, CA (US); Cecelia Campochiaro, Sunnyvale, CA (US); Yakov Bobrov, Burlingame, CA (US)

(73) Assignee: FEI Company, Hillsboro, OR (US)

( * ) Notice: Subject to any disclaimer, the term of this patent is extended or adjusted under 35 U.S.C. 154(b) by 20 days.

(21) Appl. No.: 17/117,696

(22) Filed: Dec. 10, 2020

(65) Prior Publication Data

US 2021/0098228 A1  Apr. 1, 2021

Related U.S. Application Data

(63) Continuation of application No. 16/253,786, filed on Jan. 22, 2019, now abandoned.
(Continued)

(51) Int. Cl.
| | |
|---|---|
| *H01J 37/302* | (2006.01) |
| *H01J 37/304* | (2006.01) |
| *H01J 37/305* | (2006.01) |
| *G01N 23/2257* | (2018.01) |
| *H01J 37/26* | (2006.01) |

(Continued)

(52) U.S. Cl.
CPC ........ *H01J 37/302* (2013.01); *G01N 23/2257* (2013.01); *G01R 31/26* (2013.01); *G01R 31/265* (2013.01); *G01R 31/27* (2013.01); *G01R 31/28* (2013.01); *H01J 37/266* (2013.01); *H01J 37/304* (2013.01); *H01J 37/305* (2013.01); *H01J 37/3056* (2013.01); *H01J 37/226* (2013.01); *H01J 49/14* (2013.01); *H01J 2237/30438* (2013.01); *H01J 2237/30466* (2013.01); *H01J 2237/31749* (2013.01)

(58) Field of Classification Search
CPC .......... H01J 37/302; H01J 2237/30466; H01J 37/226; H01J 37/304; H01J 37/305; H01J 37/3053; H01J 37/3056
See application file for complete search history.

(56) References Cited

U.S. PATENT DOCUMENTS

2003/0224601 A1* 12/2003 Roy .................... H01J 37/3005
                                                        438/689

* cited by examiner

*Primary Examiner* — Eliza W Osenbaugh-Stewart (57) ABSTRACT

Described herein are a system and method of preparing integrated circuits (ICs) so that the ICs remain electrically active and can have their active circuitry probed for diagnostic and characterization purposes using charged particle beams. The system employs an infrared camera capable of looking through the silicon substrate of the ICs to image electrical circuits therein, a focused ion beam system that can both image the IC and selectively remove substrate material from the IC, a scanning electron microscope that can both image structures on the IC and measure voltage contrast signals from active circuits on the IC, and a means of extracting heat generated by the active IC. The method uses the system to identify the region of the IC to be probed, and to selectively remove all substrate material over the region to be probed using ion bombardment, and further identifies endpoint detection means of milling to the required depth so as to observe electrical states and waveforms on the active IC.

17 Claims, 7 Drawing Sheets

Related U.S. Application Data (60) Provisional application No. 62/621,819, filed on Jan. 25, 2018.

(51) Int. Cl.
| | |
|---|---|
| *G01R 31/265* | (2006.01) |
| *G01R 31/27* | (2006.01) |
| *G01R 31/28* | (2006.01) |
| *G01R 31/26* | (2020.01) |
| H01J 37/22 | (2006.01) |
| H01J 49/14 | (2006.01) |

SYSTEM AND METHOD OF PREPARING INTEGRATED CIRCUITS FOR BACKSIDE PROBING USING CHARGED PARTICLE BEAMS

The present application is a continuation of U.S. patent application Ser. No. 16/253,786, filed Jan. 22, 2019, which was based on U.S. Provisional Application Ser. No. 62/621,819, filed Jan. 25, 2018. The disclosures of the foregoing applications are incorporated herein by reference.

FIELD OF THE INVENTION

This invention relates to the diagnosis and characterization of electrically active integrated circuits using charged particle beams, and to the probing of electrical activity from the backside of modern integrated circuitry while they are being electrically stimulated by a testing means. More specifically, the invention describes a system and method for preparing modern finFET integrated circuits to enable electron-beam waveform probing.

BACKGROUND OF THE INVENTION

Integrated Circuits (ICs) undergo electrical device characterization throughout their design and manufacturing life cycle to verify that the ICs are meeting their performance expectations. An IC not meeting design performance expectations may undergo a debugging and failure analysis process to determine the root cause of its non-conformance. The field of electrical failure analysis involves the diagnosis and characterization of electrically active IC devices for the purpose of identifying the root cause of such non-conformances.

BRIEF DESCRIPTION OF THE DRAWINGS

Like reference numerals refer to corresponding parts throughout the several views of the drawings.

DETAILED DESCRIPTION OF EMBODIMENTS

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

The current state of the art in electrical device characterization uses optical lasers focused on individual transistors within an IC to measure electrical activity within an active IC. See for example Kindereit, Ulrike, "Fundamentals and Future Applications of Laser Voltage Probing", IEEE Reliability Physics Symposium, pp. 1-11, June 2014. A limitation of optical probing techniques, however, is that they are unable to resolve features substantially smaller than the wavelength of the light used in the optical probe, and despite a recent push to shorten the wavelength and use visible optical probing techniques (see, for example, U.S. Pat. No. 9,651,610 B2), the feature sizes of advanced ICs have now shrunk well beyond the limit that optical diagnostic tools can resolve. A renewed interest therefore exists for diagnostic tools that derive their imaging resolution from charged particle beams that can resolve features much smaller than optical wavelengths.

Diagnostic tools able to perform electrical device characterization of ICs using charged particle beams have existed for several decades. For example, U.S. Pat. No. 4,706,019 filed in 1985 discloses an electron beam test probe system for analyzing ICs from their front side. During the 1990s, however, advanced ICs became packaged in a "flip-chip" state where access to the front active side of an active IC was no longer possible, and this advance in packaging led to a need to probe ICs from their back substrate side. U.S. Pat. No. 5,972,725 (hereafter '725) discloses a method of precisely measuring electrical parameters from the back substrate side of an IC by using a scanning electron microscope probe directed at active regions of the IC exposed by the removal of the semiconductor substrate. U.S. Pat. No. 6,872,581 (hereafter '581) discloses a method of probing active ICs from their back substrate side using charged particle beams—electron or ion beams—directed at a thinned substrate layer where electrical activity beneath the thinned substrate layer induces an electrical potential on the outer surface that is probed by the charged particle beam. Thus '725 teaches a method of using a scanning electron microscope to measure electrical activity from the backside of an IC by thinning the substrate all the way to the active regions of the IC, while '581 allows that either an electron or an ion microscope can probe electrical activity from a surface near, but not at, the active regions of the IC.

In the fifteen to twenty years since the '581 and '725 patents were issued, advanced semiconductor manufacturers have transitioned from bulk active devices that could extend over one micron in depth into their silicon substrate to a tri-gate (also known as a finFET) transistor architecture. A typical tri-gate transistor in an advanced IC will consist of a fin of silicon that is of order ten nanometers wide, fifty nanometers tall, and having a gate that is of order ten or fewer nanometers long. As a result, electrical activity within active silicon resides within the topmost fifty nanometers of the IC substrate. To prepare such a sample for charged particle probing, the substrate material needs to be removed to expose the bottom side of the fins of silicon that comprise the active transistors of the IC. The '725 patent envisioned removing the bulk substrate to a region approximately one micron from the front side of the IC, while the '581 method envisioned removing the bulk substrate to within one to three microns. With modern tri-gate transistors, however, the substrate must be removed to within approximately fifty nanometers of the front side of the IC, with a tolerance of only ten or twenty nanometers, and such sample preparation presents a challenge that was not anticipated by the '581 and '725 patents. If too little substrate material is removed, the individual transistor fins are not exposed and cannot be electrically exposed, yet if too much substrate material is removed, the transistor fins themselves will be removed, thereby preventing their electrical characterization.

We disclose a system and method for preparing modern tri-gate semiconductor ICs so that their electrical activity can be probed using charged particle beams. Charged particle beam microscopy can easily resolve feature sizes of one nanometer and below, which is a one hundred-fold improvement over the best resolution achieved with optical microscopy and laser voltage probing. The technique described enables the removal of substrate silicon from the IC all the way down to, but not through, the active transistor fins of the IC.

The following describes techniques for preparing modern tri-gate semiconductor ICs so that their electrical activity can be probed using charged particle beams. Embodiments are disclosed to achieve this goal, but the method described herein should not be restrictive as those skilled in the art will understand that various modifications to the process may be made without departing from the spirit of this invention. For instance, the techniques described herein could also be used to prepare future semiconductor ICs that use next-generation gate-all-around (GAA) transistors, nanowire transistors, three dimensional IC structures, transistors that are not built using silicon, and in general, any substrate thinning process that requires very precise endpoint detection to effect device characterization using charged particle techniques.

A conventional IC may be patterned and built on the front side of a silicon substrate, with the substrate being approximately 760 microns thick. For modern ICs, as discussed above, the active circuitry comprises fin-shaped tri-gate transistors that reside within approximately fifty nanometers of the silicon surface. Processes are disclosed for the removal of nearly the entirety of this substrate material so that in the end only the active transistors remain and the IC remains electrically functional.

Conventionally, ICs are tested by attaching them to a printed circuit board known as a load board. The load board, in turn, typically connects to an automated electrical tester that powers the IC and supplies electrical test signals, and, in some embodiments, the load board will form a sliding vacuum seal required to both position the device under test (DUT) relative to the charged-particle beams, and to maintain needed vacuum integrity within the microscope. If the IC needs to be soldered to the load board for electrical testing, it should be soldered to the board before any other sample preparation steps are taken because the thermal stress of the soldering process can damage thinned IC devices, e.g., ICs having bulk material removed to expose all or some of the active structure.

Figure 1A:
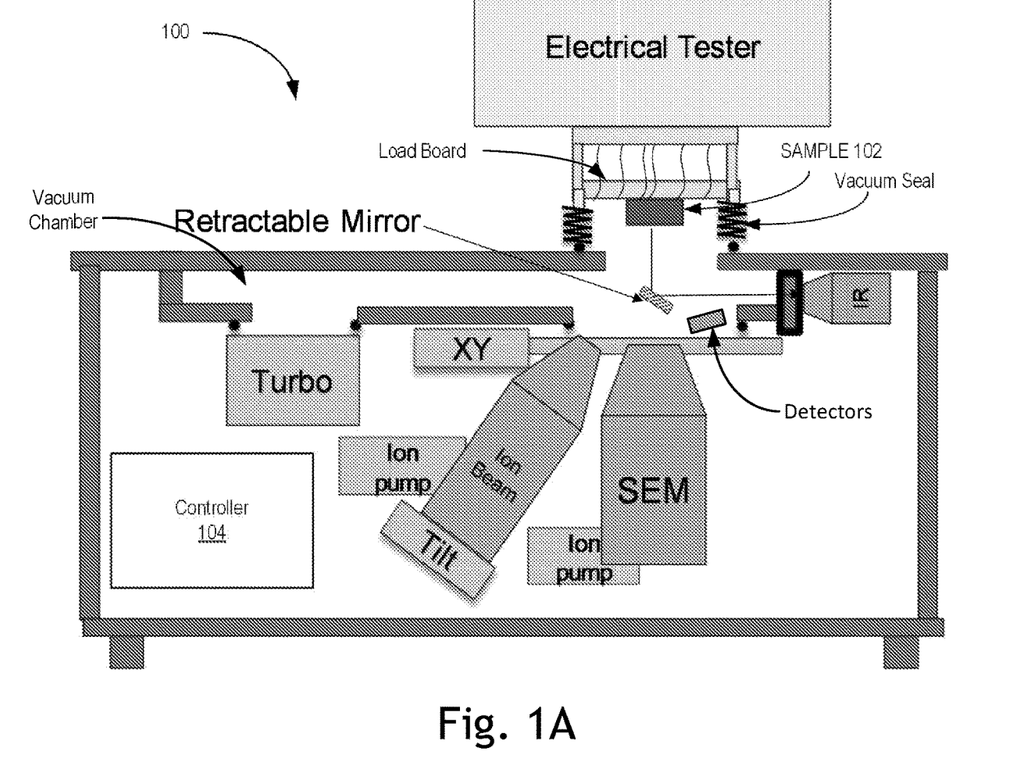
FIG. 1A is an example charged particle beam system 100 in accordance with an embodiment of the present disclosure.

FIG. 1A is an example charged particle beam system 100 in accordance with an embodiment of the present disclosure. The system 100 may be a dual-beam system, as known in the art. For example, the system 100 may include both an electron beam column and an ion beam column. The column labeled SEM may include an electron emitter, such as a Schottky emitter, various lenses for focusing the electron beam, and detectors. The detectors may be used to detect backscattered and secondary electrons, for example, but other photon-centric detectors may also be included, such as ultraviolet, visible, and infrared light detectors and/or x-ray detectors. The ion beam column, labeled as such in FIG. 1A, includes an ion source, such as a plasma or liquid metal ion source, along with focusing optics for shaping the ion beam. The detectors discussed above in relation with the SEM column may also be used in conjunction with the ion beam column. For example, secondary electrons and/or secondary ions may be detected when the sample is subject to an ion beam.

The system 100 further includes an infrared imaging system for locating regions of interest in the active area of the sample 102. The regions of interest are areas where one or more transistors, e.g., finFETs, are to be analyzed. Locating the one or more transistors helps the system 100 navigate to the area that requires additional processing to expose the regions of interest. The infrared imaging system at least includes a retractable mirror and an infrared camera, labeled IR in FIG. 1A. Additionally (and not shown), the infrared imaging system includes a suitable IR source for projecting IR light through a sample and towards the retractable mirror.

The system 100 also includes an electrical tester that can be coupled to an IC under test (e.g., sample 102), which may also be referred to as a device under test (DUT). The electrical tester may provide clock and/or data signals to one or more functional blocks of the IC device to drive the transistors of the functional block. One or more of the transistors of a designated area, e.g., region of interest, may desirably be examined for failure mechanisms, and which may be excavated by ion milling, for example, for specific testing. The excavation of the transistors may be performed as disclosed herein.

The system 100 also includes other ancillary equipment for producing a low pressure environment required for operating the ion beam and SEM columns. For example, a vacuum seal may seal the sample 102 and electrical tester to the SEM column, ion beam column, and infrared imaging system. To generate the low pressure/high vacuum environment, the system 100 includes a turbo pump, and one or more ion pumps, all coupled to the vacuum chamber. A stage may be included in the vacuum chamber to manipulate the location of the ion beam and SEM columns, the sample 102, or both. The stage may be moved in at least three degrees of freedom, but additional degrees may also be included allowing for both translational and rotational movement.

Figure 2A:
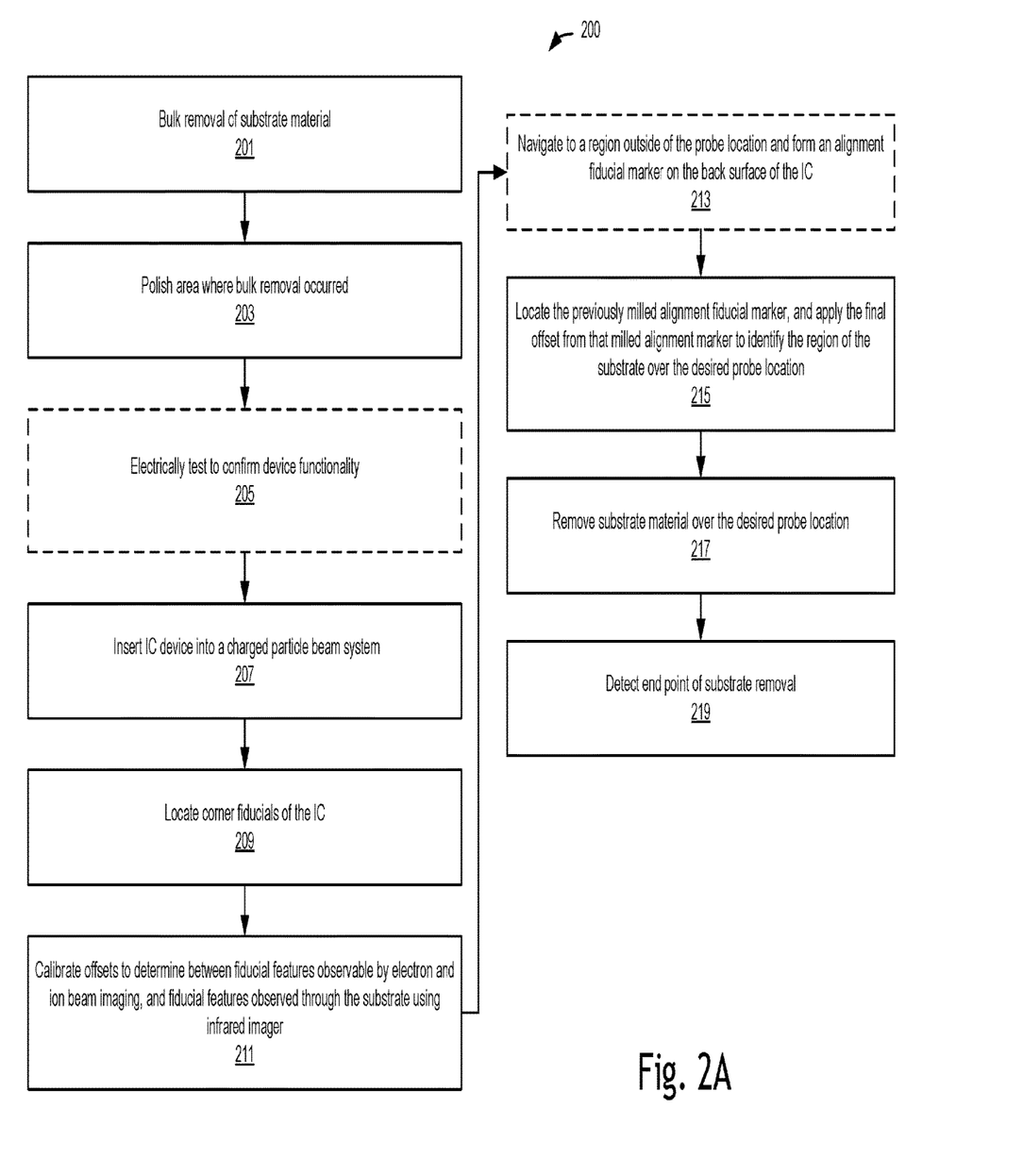
FIG. 2A is a flow chart of an example method 200 in accordance with an embodiment of the present disclosure.

Additionally, the system 100 includes a controller coupled to the ion beam column, the SEM column, the detectors, the infrared imaging system, the electrical tester, and the vacuum pumps. The controller is coupled to control operation of the various components for implementing the techniques disclosed herein. For example, the method 200, discussed in detail below, may use the SEM, detectors, and ion beam columns along with the infrared imaging system to prepare the sample 102 for electrical testing. Specifically, the method 200 may include locating a desired probe location, milling substrate material to uncover the probe location, and end point detection to determine when a transistor to test has been uncovered. The end point detection may be sensitive enough to remove oxide material without detrimentally affecting the transistor regions so that electrical testing may occur while physical probing of the transistor occurs, such as with optical or electron beam techniques.

The sample 102, which may be thermally managed, is coupled to a load board. The load board is coupled to the electrical tester, and the sample 102. The load board relays electrical test signals from the electrical tester to the sample 102. FIG. 1A shows an example location for the load board. In other embodiments, the load board may be on the bottom side of the sample 102. In some embodiments, the load board may be used for coupling the vacuum chamber to the electrical tester and may include at least two dimensional alignment mechanics. In some embodiments, the load board may include heat sinking and heat exchange aspects to remove heat from the sample 102. For example, the load board may include a fluid heat exchanger or a thick copper plane, but other techniques may also be implemented.

Figure 1B:
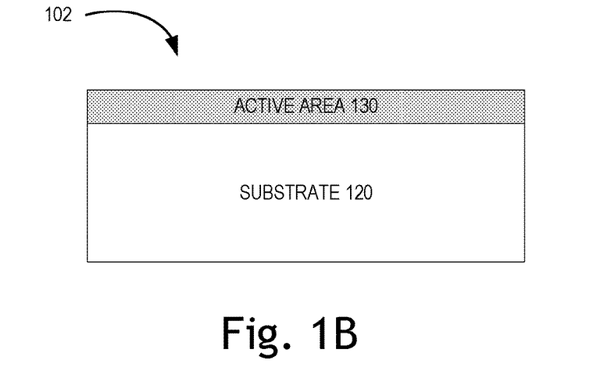
FIG. 1B is an example IC 150 in accordance with an embodiment of the present disclosure.

FIG. 1B is an example IC 102 in accordance with an embodiment of the present disclosure. The IC 102, which may also be simply referred to as sample 102, includes a substrate 120 and an active area 130. The substrate 120 may be formed from any known semiconductor material, such as silicon, GaAs, InP, Ge, GaN, etc. While silicon is used to illustrate the disclosure, the disclosure is not limited as such. The active area 130 may include one or more levels of active circuitry, such as transistors coupled by metal traces. In some examples, the transistors are finFETs, as discussed herein. However, while the disclosed processing techniques may be advantageous for finFET processing, the techniques are not limited by the transistor technology. As used herein, a backside of the sample 102 is the substrate side whereas a front side of the sample 102 is the active area 130 side.

FIG. 2A is a flow chart of an example method 200 in accordance with an embodiment of the present disclosure. The method 200 may be implemented on the system 100, for example, to at least partially prepare and locate a desired transistor, circuit(s), electrical trace, or combinations thereof, of a sample or IC, such as the sample 102, to undergo electrical testing. While some of the preparation steps may be performed in the example system 100, other steps may be performed outside of and prior to loading an IC into the system 100. For example, bulk removal of substrate material may be performed prior to loading the sample into the system 100. While not all examples of sample preparations, e.g., material removal and end point detection, are explicitly covered herein, they are within the bounds of the present disclosure and fully contemplated.

The method 200 may begin at step 201, which includes the bulk removal of substrate material from a back side of an IC or sample. The IC or sample may be formed in or from silicon, GaAs, InP, Ge, or any semiconductor material. While silicon may be used as an illustrative example in the disclosure, the disclosure should not be considered so limited. The bulk removal may be implemented using one or more mechanical techniques, such as lapping, milling, polishing, or may be implemented using other techniques commonly used to thin semiconductor substrates, such as laser ablation, chemical etching, etc. In some embodiments, a combination of techniques may be used to remove the bulk substrate material. Also known to those skilled in the art of preparing samples are tools for accurately measuring residual substrate thickness after the milling process. In some embodiments, the substrate need not be thinned over the entire region of the IC, and the thinning may be confined to an area above a region of interest, e.g., a desired probing region in an active area disposed on an opposite side of the IC. For example, a small pocket can be formed within the IC substrate using one or more mechanical milling techniques. In some embodiments, the bulk removal of the substrate may include removal of substrate across an entire backside of an IC or sample. In other embodiments, the bulk removal may be performed in a small area on the backside above a desired probe area, e.g., a region of interest.

The step 201 may be followed by the step 203, which includes polishing the backside of the IC or sample. The polishing may be performed using any known method for wafer material polishing, such as using a slurry and polishing pad. In some embodiments, it may be desirable for the polishing step to result in an optically smooth surface. As an example, thinning an IC or sample to approximately 20 microns residual thickness of substrate material using a mechanical technique, then removing another 10 microns in a polishing process that progressively uses finer polishing compounds results in an IC with approximately ten microns of residual silicon substrate having an optically smooth sub-micron surface roughness. The optically smooth sub-micron surface roughness may be desirable to reduce or eliminate uneven exposure of the active transistor fins post a subsequent thinning step, such as a plasma-based thinning process. If the residual silicon is substantially thicker than ten microns after polishing (e.g., 15 microns or more residual thickness), then the subsequent thinning process may require excessive time to complete. On the other hand, if the residual silicon after polishing is substantially thinner than ten microns (e.g., 5 microns or less), the subsequent thinning process may not eliminate the surface roughness left after the mechanical polishing process and will lead to uneven exposure of the active transistor fins.

The step 203 may optionally be followed by step 205, which includes electrically testing the IC or sample to confirm device functionality. Once proper functionality is confirmed, the IC device can be inserted into a charged particle beam system (step 207). In some embodiments, the charged particle system, such as the system 100, may include a scanning electron microscope for imaging and electrically probing nanometer features on the IC, a focused ion beam tool capable of imaging and removing the residual substrate material to the level of the fin transistors, and an infrared imaging system capable of looking through silicon substrate material to see features that have been patterned onto the IC during its manufacture. In other embodiments, the charged particle system may omit the infrared imaging system.

The step 207 may be followed by the step 209, which includes locating corner fiducials that have been patterned onto the IC surface during its manufacture. In some embodiments, the corner fiducials may be observed by looking through the silicon substrate using the infrared camera, which may allow the corner fiducials, which are on the front side, be located. The infrared camera must have an infrared illumination source to illuminate the IC for inspection. The infrared camera is used to determine and calibrate an offset between the known corner fiducials that are visible beneath the substrate, e.g., on the front side, and other fiducials, such as chip corners, that can be observed using electron and ion beam imaging, neither of which can image through the remaining substrate material and image the corner fiducials on the front side of the IC.

Step 209 may be followed by the step 211, which includes calibrate offsets to determine between fiducial features observable by electron and ion beam imaging and fiducial features observable through the substrate using infrared imaging. Once calibrated offsets have been determined, see FIGS. 3A through 3C for detail, between fiducial features observable by electron and ion beam imaging, and fiducial features observed through the substrate using the infrared imager, a mechanical stage system can move to any location on the IC. For example, a debug technique will specify a region of the IC to be probed, and the coordinates of that region will be known. The region of the IC to be probed could be an individual transistor, a small circuit comprised of several transistors, a region containing many circuits, or even a metal trace of the IC. With the coordinates of the region to be probed, and having the calibrated offsets as described, mechanical stages can move the IC to position the known probe location in an optimal location to be acted upon by the focused ion beam tool.

The step 211 may be followed by the step 213, which includes navigating to a region outside of the probe location, e.g., the region of interest, and milling an alignment fiducial marker on the backside surface of the IC. The alignment fiducial may reduce or eliminate possible navigation errors by helping more accurately determine where the probe location and final milling should be performed. The milling of the alignment fiducial, in some embodiments, may be performed using a focused ion beam tool, which may be a plasma-based ion mill. For example, a 5 micron square region 0.5 microns deep is easily observed in all three (e.g., electron, ion, and infrared) imaging modalities. Once such an alignment fiducial marker has been created, an infrared image of this region will be captured (see FIG. 3B, for example), and such an image will clearly show the region where electrical probing is desired, adjacent to the alignment fiducial marker, and a precise offset between these two can be calculated, e.g. ΔX and ΔY. This step may eliminate the navigation uncertainties and errors associated with the previous steps of the process, and provide certainty that the region of the substrate opened up in the following steps may be precisely collocated with the desired electrical probe location. In some embodiments, step 213 may be optional and other methods may be used to more precisely locate the probe location. For example, the backside of the IC may be milled at the corners to locate the corner fiducials and make them observable using electron or ion imaging. Then, the combination of CAD files and the located corner fiducials may be used to locate the probe location. While this alternative method may work, the two extra milling steps to uncover the corner fiducials results in longer processing time, and the end result may be less precise than forming the alignment fiducial.

Step 213 may be followed by the step 215, which includes locating the previously milled alignment fiducial marker and applying the final offset from that milled alignment fiducial marker to identify the region of the substrate over the desired probe location. For example, with the final offset between the alignment fiducial marker and the desired probe location measured, the mechanical stages may again position the IC beneath the focused ion beam where the location may be imaged. Imaging with the ion beam locates the previously milled alignment fiducial marker, and the final offset is applied from that marker to identify the region of the substrate over the desired probe location.

Step 215 may be followed by the step 217, which includes removal of the residual substrate material over the desired probe location. For example, the focused ion beam can be programmed to remove a desired amount of substrate material over the desired probe location. Because the amount of substrate material to be removed can be accurately measured during the sample preparation phase, and because focused ion beams have a calibrated substrate removal rate, a timed technique may be employed to remove the bulk of the remaining substrate thickness. For instance, if the substrate is known to be ten microns thick, it is common to remove all but one or two microns of substrate material using plasma-based focused ion beam milling over the desired probe region.

The step 217 may be followed by step 219, which includes detecting the end point of substrate removal to uncover the desired probing area. At the beginning of step 219, very little (e.g., one or two microns) substrate material may remain covering the fin transistors of the IC, e.g., the probe area, and subsequent removal of the material must be monitored to detect when the fin transistors have been reached. As previously mentioned this is a delicate end point detection process with a required tolerance of approximately ten nanometers.

Figure 2B:
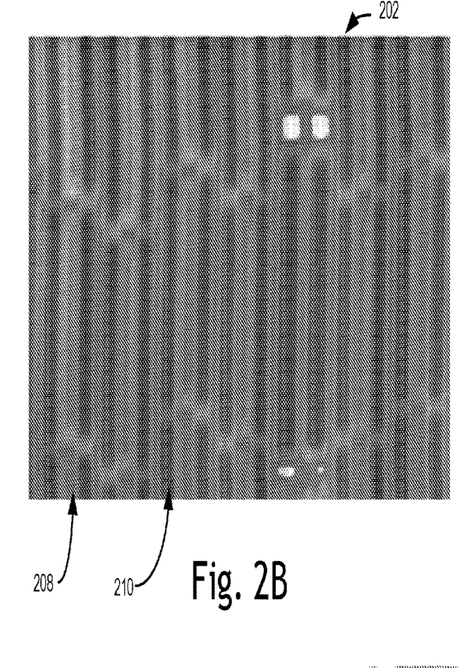
FIGS. 2B through 2D are illustrations of end point detection in accordance with an embodiment of the present disclosure.
Figure 2C:
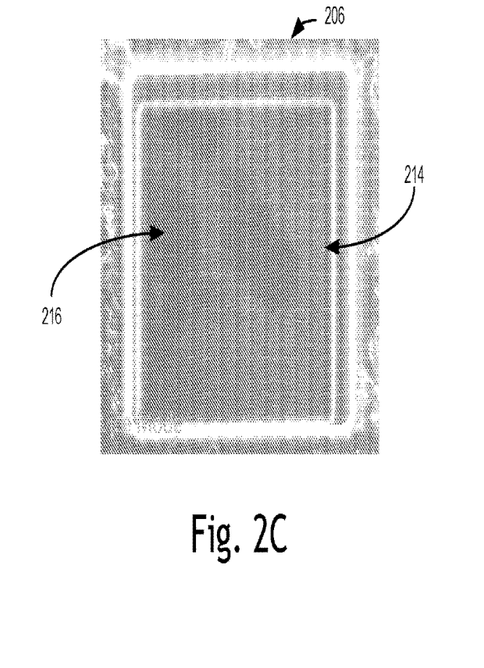

Various end point techniques may be employed in step 219, as discussed herein and shown in FIGS. 2B through 2C, and multiple of those techniques may be combined in one or more embodiments. The various end pointing techniques use a signature of the probe location to determine when to terminate the milling process, wherein the signature indicates that the underlying active layer has been reached, e.g., that a thin layer of the substrate has been milled through to uncover the active layer. One technique involves the monitoring for and detection during the ion milling process of a change in image contrast, see FIG. 2B for an example, to indicate the underlying active layer has been reached during the milling process. Tri-gate transistors consist of narrow fins of silicon surrounded by a silicon dioxide region known as the shallow trench isolation (STI) region. As the ion beam from the focused ion beam mills through substrate material, secondary electrons are emitted by the substrate material and it is those secondary electrons, when captured, create the ion beam image of the substrate surface, see image 202 for an example. It is known that the secondary emission rate from silicon differs from that of the STI such that a change in image brightness occurs when this STI region is reached. Further, the STI region between individual fin transistors is more shallow than the STI region between blocks of fin transistors, so the pattern of the STI layer can be used to precisely locate the depth at which the fins become exposed. For example, the STI region 208 between a block of fin transistors may be uncovered and observable before the STI region 210 between individual fin transistors within a block, and an image showing inter-block STI 208 may be used to slow the milling to determine when the intra-block STI region 210 appears. This is one method of ending the focused ion beam milling process.

Another method for implementing the step 219 may use optical or x-ray emission of sputtered atoms as indicating an end point to the milling has been reached based on monitoring for and detecting such optical or x-ray emissions. As an example, as the plasma focused ion beam mills away at the substrate, substrate (silicon) atoms will be sputtered off the surface, some of which become electrically excited in the process and can relax to their ground state, emitting light in the process. This process may be referred to as ion-induced light emission. Light emitted from silicon has a different spectrum than light emitted from a sputtered oxygen atom, hence the presence of characteristic spectrum of oxygen atoms can indicate that the milling process has reached one of the STI layers. Similarly, bombardment of the surface with high energy electrons or ions may produce characteristic x-ray signatures identifying the material as either silicon or oxygen, and the presence of oxygen x-ray emissions can similarly identify that the STI layer has been reached.

Another method for implementing step 219 uses an ion mass spectrometer, for example a residual gas analyzer, to monitor for and detect the presence of oxygen ions in the vacuum chamber when the plasma reaches the STI layer. Such detection indicates that the milling should be stopped due to reaching the underlying STI layer.

Another method for implementing step 219 involves going back and forth between ion beam milling and electron-beam imaging to monitor for indications that the milling has reached the active layer. Specifically, imaging using backscattered electrons from a higher energy (typically 5 keV or higher), see FIG. 2C for an example, electron source enables the user to see through 50 to 100 nm or more of substrate material, thus when patterned features on the IC surface become visible in the backscattered electron image, it is known that fin transistors are very close to emerging from the substrate, and this information can be used to control the final ion beam milling step. For example, in image 206, which was obtained with an electron energy of 10 keV, underlying patterns 216 have become visible through a thin (50 to 100 nm) layer of silicon 214. The initial visibility of the underlying patterns at high electron energy, as noted, provides guidance regarding the amount, e.g., thickness, of the overlying layer, which may then guide subsequent milling steps.

Yet another method for implementing step 219 involves looking for voltage contrast in the scanning electron microscope image as the device is thinned using the ion beam. This has two possible forms. A first form, and one known in the art, includes the use of voltage contrast imaging, see FIG. 2D for an example. For example, since the IC is powered, it can be placed in a state with known potentials on known circuitry, and the technique of voltage contrast imaging, which is known to all skilled in the art of electron microscopy, can be used to detect close proximity to active circuitry. Such techniques were disclosed in the '581 and '725 patents. In image 204, voltage contrast mapping shows circuits 212 beginning to be visible through an overlying layer do to thinning of that overlying layer. It should also be noted that image 204 is the voltage contrast image of image 202.

Figure 2D:
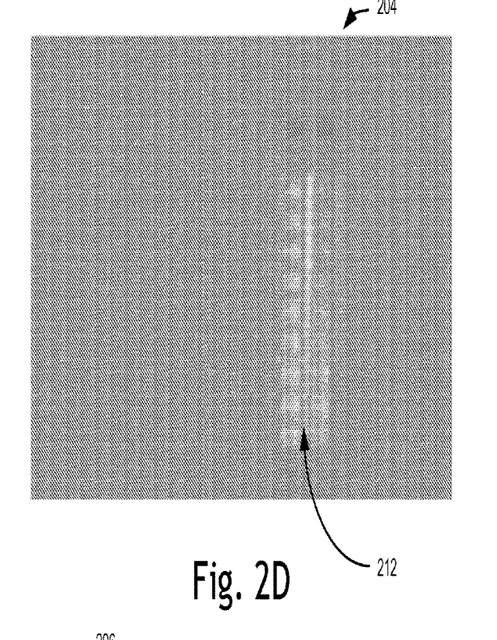

A second and new form enables alternating potentials to be easily measured from active fin transistors. This technique is the electron-beam analog of the optical technique disclosed in U.S. Pat. No. 9,239,357 titled "System and method for modulation mapping." Specifically, a periodic signal such as a clock source can drive transistors on the IC, and all such transistors driven by the clock will show a voltage contrast signature at the frequency of the clock. By looking for that frequency in the detected electron microscope image, using either a lock-in amplifier technique or a spectrum analyzer, tuned to the specific clock frequency and configured to generate an output signal in proportion to the strength of the clock signal detected, it is possible to stop milling precisely at the depth where the desired voltage contrast signal due to electrical activity on the IC is detected. This technique works equally well for electron and ion imaging modalities, such that it is possible to be milling through substrate material while simultaneously monitoring the secondary electron emission for signs of electrical activity, and to stop milling when such signs are seen. This method guarantees that the end point of the milling process occurs at the active fin transistor level of the IC. Image 204 provides an example of the outcome of this technique as well, but the steps taken to obtain such an image will be as discussed in this paragraph as opposed to the preceding paragraph.

Figure 3A:
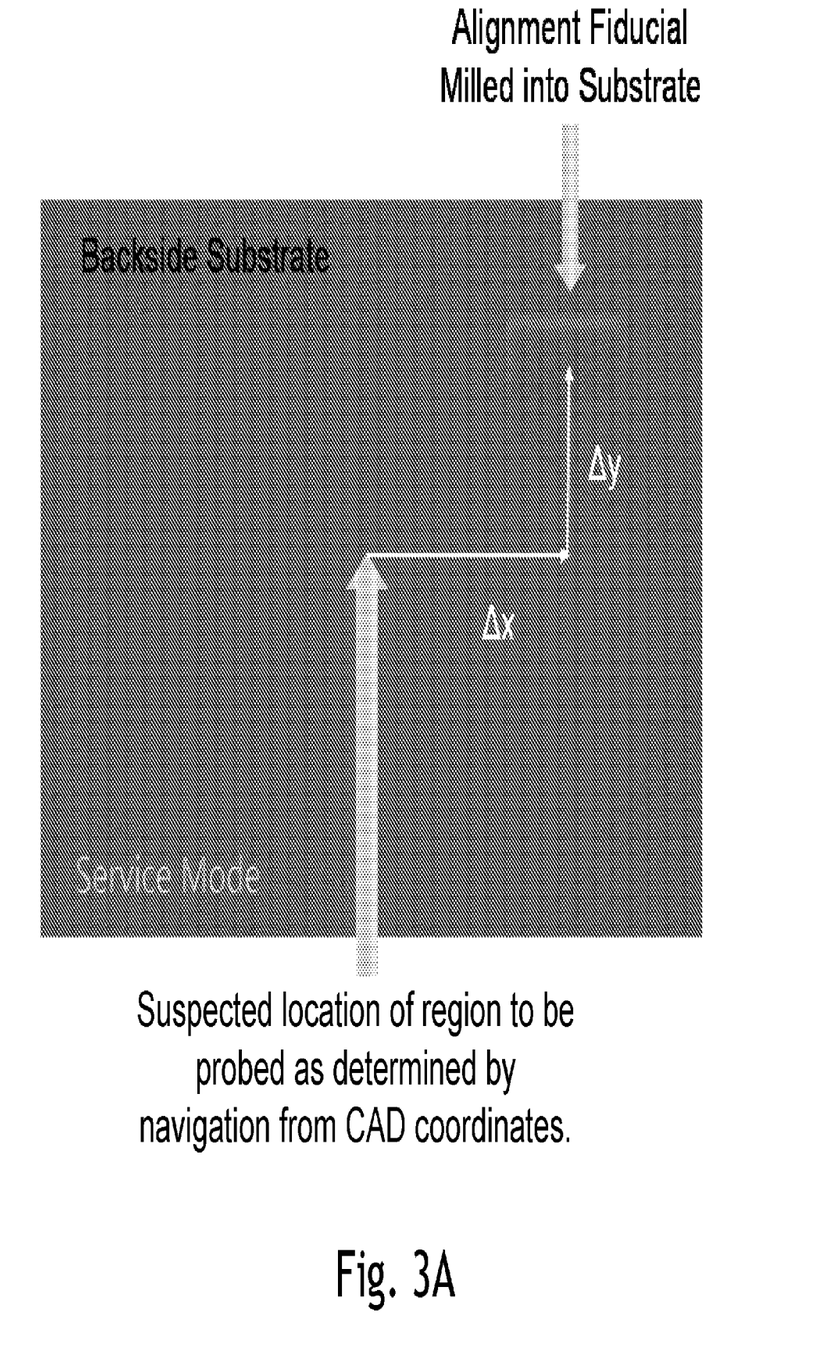
FIGS. 3A through 3C are example images of determining offsets between a milled alignment fiducial marker and a probe area in accordance with a disclosed embodiment.
Figures 3B, 3C:
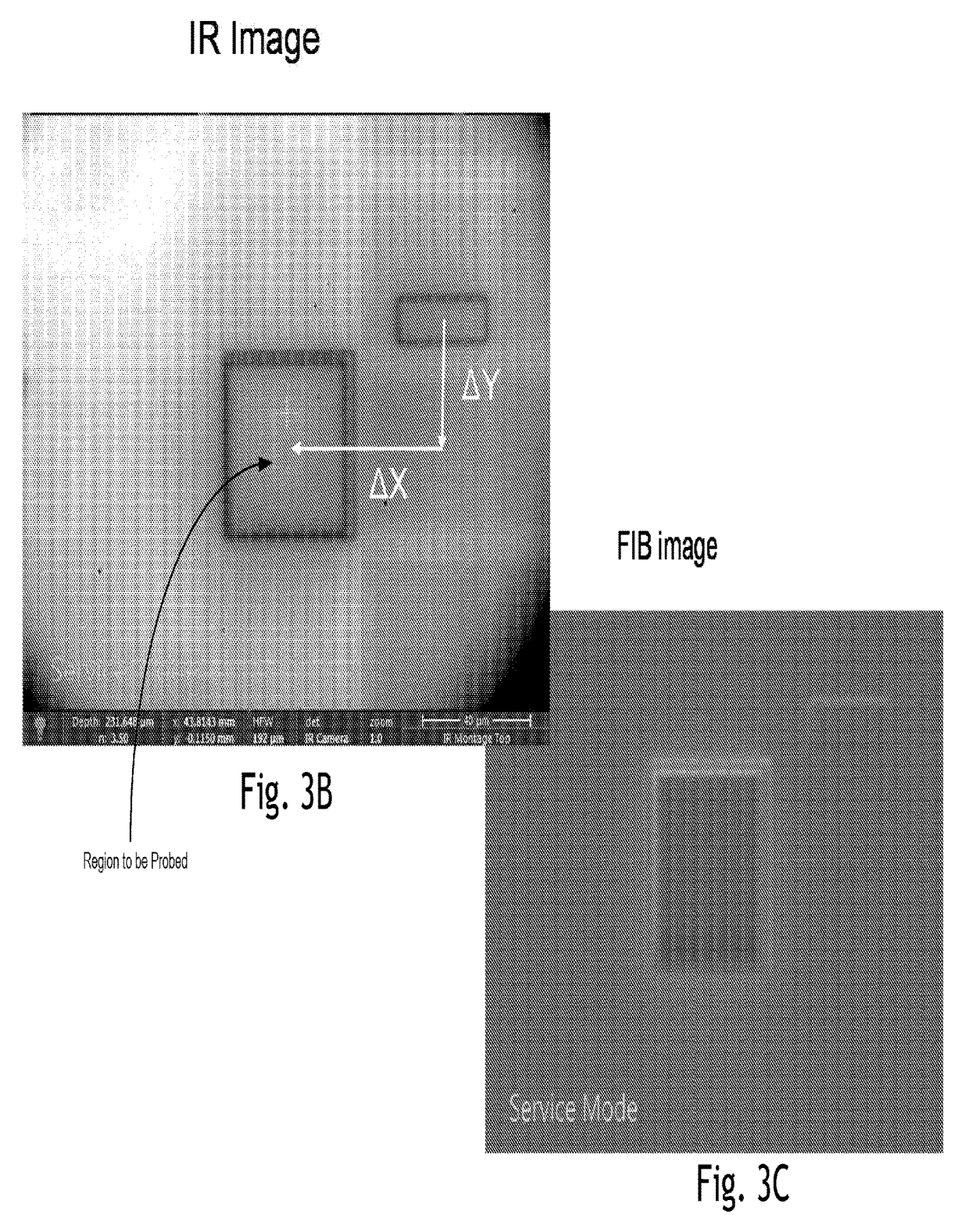

FIGS. 3A through 3C are example images of determining offsets between a milled alignment fiducial marker and a probe area in accordance with a disclosed embodiment. A first step in determining the offsets may include forming an alignment fiducial marker outside of where the desired probe area may be. As discussed above, the desired probe area may be known but its location not precisely known. However, a CAD file showing the location with respect to the corner fiducial markers may be known. As such, the system may move the stage to an area outside of the desired probe area based on the CAD file and the obtained IR image of the corner fiducial markers. At this area, the alignment fiducial marker may be milled into the backside surface of the IC using offsets $\Delta x$ and $\Delta y$ from the desired probe area, or what is assumed to be above the desired probe area. FIG. 3A shows the suspected location of the probe area, the offsets $\Delta x$ and $\Delta y$, and the alignment fiducial marker milled into the backside of an IC.

Subsequently, the infrared imaging system is used to locate the milled alignment fiducial marker and the desired probe location. See FIG. 3B for an IR image. Using the infrared image, the system measures where the desired probe location is with relation to the alignment fiducial marker and adjusted offsets $\Delta X$ and $\Delta Y$ are determined. The adjusted offsets should be more exact than the initial guess offsets.

Based on the adjusted offsets $\Delta X$ and $\Delta Y$, the remaining substrate is milled to fully uncover the desired probe area. For example, a box centered on the adjusted offsets is milled. In some embodiments, multiple boxes of decreasing area may be milled to fully uncover the desired probe area, as seen in FIGS. 3B and 3C. While the area being milled is shown as a "box," e.g., a square or rectangle, the shape of the area being milled is not so limited. In general, any geometrical shape may be used to define the target milling area. In other embodiments, the target milling area may be define by a target volume, which may be further defined by a pixel-by-pixel milling depth.

Figure 4A:
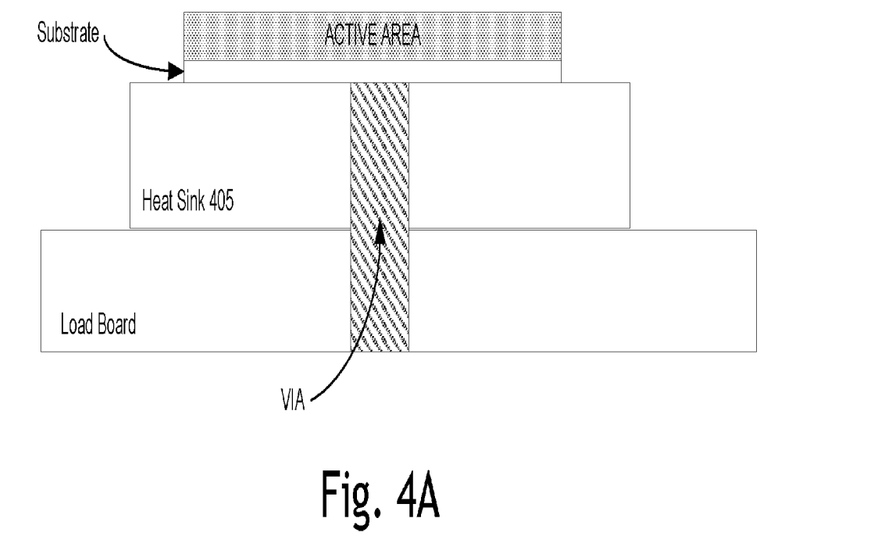
FIGS. 4A through 4C are example heatsinking configurations in accordance with a disclosed embodiment.
Figure 4B:
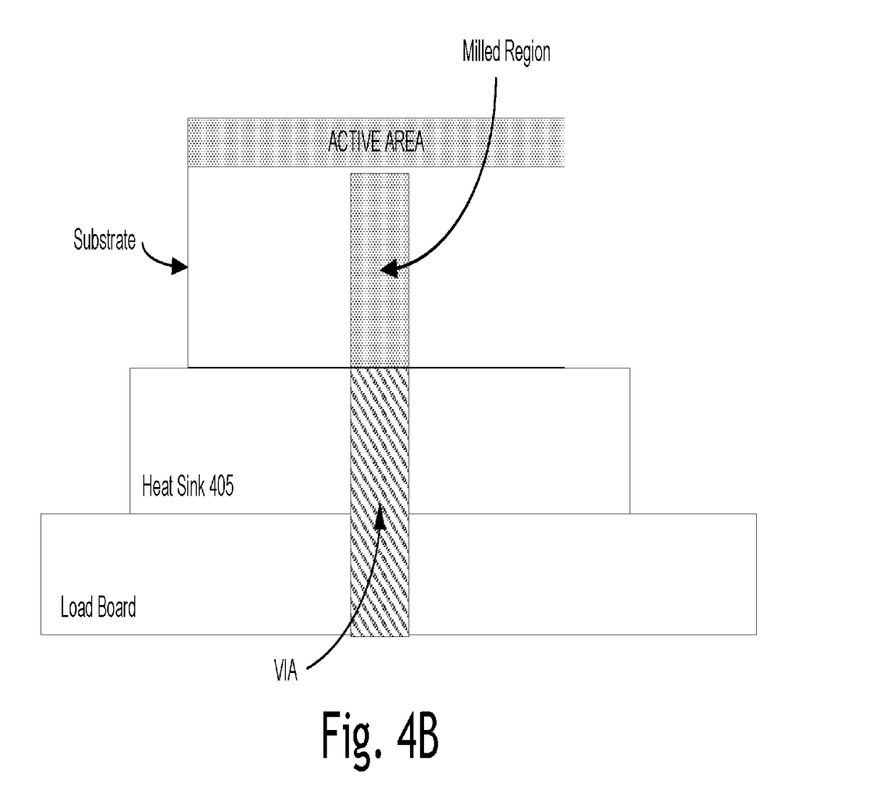
Figure 4C:
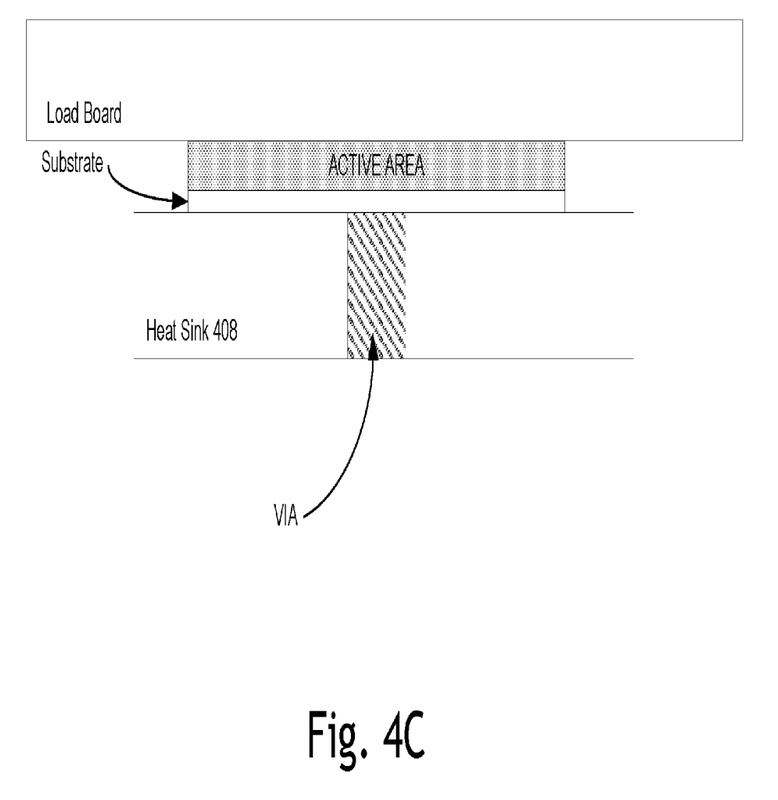

FIGS. 4A, 4B and 4C are example heatsinking configurations in accordance with embodiments of the present disclosure. Because active ICs under electrical test create heat, the removal of the heat is generally desired to reduce thermal expansion and drift, and to improve device testing environment, for example. However, the removal of this heat poses challenges in the vacuum systems required of electron and ion beam systems. Further, thermal drift caused by this heat will need to be accounted and compensated for during the time it takes to measure electrical activity on the IC. As a result, the IC devices for electrical probing may be prepared with the requirements of heat removal and thermal drift accounted for. One technique for removing heat involves thinning the substrate uniformly to a known thickness, such as ten microns as described earlier. If the entire sample is uniformly thinned, this enables mating a heat sinking material to the thinned IC to remove heat from the active IC, as shown in FIG. 4A. Such heat could be transferred laterally off the IC to a surrounding region. For example, if the DUT is mounted to a load board, the load board could be thermally coupled to, and dissipate heat from, the DUT via the DUT's heat sinking material 405. To accomplish this, the load board could contain its own heatsink embedded within it (not shown), such as a thick copper plane, or gas, liquid, or phase-change means of removing heat from the load board, with the DUT heatsink 405 in thermal connection with the load board heat sink, such that the final objective of keeping the DUT cooled is achieved. Further, said DUT heat sink could contain a via, such as a hole, several holes, a slot, multiple slots, and the like, through which ion milling and e-beam probing can occur. Moreover, to provide access to the DUT for testing and probing, the load board may have an aperture that can be aligned to the via in the heatsink 405. While the figure shows the via and the aperture commensurate in size, e.g., diameter, the size of each opening may be different.

An alternate method of sample preparation could involve mechanically opening up a small region, e.g., a via, of an IC, as shown in FIG. 4B. For instance, a full-thickness IC is typically built on silicon substrates that are 760 microns thick. Such thick substrates effectively disperse heat and it may be advantageous to leave the IC at full thickness for reasons of heat dissipation and removal, however the device still needs to be electrically probed. This may represent a case where a small region could be milled into the full-thickness device, thereby enabling electrical probing of a small region while the remainder of the IC is cooled as originally designed. Alternatively the IC having just a small region milled may also be thermally coupled to a heat sink for improved thermal dissipation.

In other embodiments, the DUT may be coupled to a thermally conductive gasket 408 to provide a vacuum interface so that the DUT is thermally coupled to the vacuum chamber. See FIG. 4C. In such an embodiment, the vacuum chamber provides the heat sinking through the thermally conductive gasket 408, which may reduce the need for a heat sink included in the load board and another coupled to the DUT as shown in FIGS. 4A, 4B.

Owing to the heat generated by the DUT, as well as the nanometer-scale dimensions of the fin transistors themselves, it is anticipated that thermal drift between the DUT and the charged particle columns may present a system stability challenge. For instance, it may take tens of minutes to make a complex measurement, and during that time a single 10-nm transistor may need to be imaged continually, thus a means of compensating for the thermal drift will be required. Several such methods to compensate for thermal drift are known by those skilled in the art of microscopy, as are mechanical and electrical means of compensating for vibration, and those technique will not be described herein.

Having described and illustrated the principles of the disclosed technology with reference to the illustrated embodiments, it will be recognized that the illustrated embodiments can be modified in arrangement and detail without departing from such principles. For instance, elements of the illustrated embodiments shown in software may be implemented in hardware and vice-versa. Also, the technologies from any example can be combined with the technologies described in any one or more of the other examples. It will be appreciated that procedures and functions such as those described with reference to the illustrated examples can be implemented in a single hardware or software module, or separate modules can be provided. The particular arrangements above are provided for convenient illustration, and other arrangements can be used.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use. We therefore claim all that comes within the scope of the appended claims.

What is claimed is:

1. A method comprising:
   removing bulk material from a backside of a sample, a front side of the sample including an active layer, wherein removal of the bulk material leaves a thin layer of the bulk material covering the active layer on the backside;
   locating corner fiducials on a front side of the sample using an infrared imaging system;
   locating a probe area based on coordinates provided by a debug control;
   locating a region outside of the probe area;
   milling an alignment fiducial on the backside of the sample in the region outside of the probe area;
   imaging the probe area and the alignment fiducial using the infrared system;
   determining an offset between the alignment fiducial and the probe area based on the imaging; and
   locating the probe location based on the offset;
   milling, by an ion beam, the thin layer to expose the probe area of the active layer;
   monitoring the milling of the thin layer based on a signature of the probe location indicating that the active layer has been reached; and
   terminating, in response to the monitoring, the milling.

2. The method of claim 1, wherein monitoring the milling of the thin layer based on a signature of the probe location indicating that the active layer has been reached comprises:
   detecting an image contrast while milling the thin layer, the image contrast indicating the active layer has been reached.

3. The method of claim 2, wherein detecting an image contrast while milling the remaining material from the backside of the sample comprises:
   detecting a change in image brightness between components in the probe area formed of silicon oxide and components in the probe area formed of silicon.

4. The method of claim 1, wherein monitoring the milling of the thin layer based on a signature of the probe location indicating that the active layer has been reached comprises:
   detecting ion induced light emission from atoms sputtered off the backside, wherein oxygen provides a different light emission than silicon, and wherein oxygen indicates the active layer has been reached.

5. The method of claim 1, wherein monitoring the milling of the thin layer based on a signature of the probe location indicating that the active layer has been reached comprises:
   detecting characteristic x-ray signatures to identify material on the surface of the backside, wherein detection of oxygen indicates the active layer has been reached.

6. The method of claim 1, wherein monitoring the milling of the thin layer based on a signature of the probe location indicating that the active layer has been reached comprises:
   detecting presence of oxygen atoms in the vacuum chamber using ion mass spectroscopy, wherein the presence of oxygen indicates the active layer has been reached.

7. The method of claim 1, wherein monitoring the milling of the thin layer based on a signature of the probe location indicating that the active layer has been reached comprises:
   alternating between the milling of thin layer and electron-beam imaging of the backside to determine when an underlying pattern of the active layer is within 10 to 100 nm from the surface to calibrate and slow the milling of the thin layer, wherein the electron beam imaging is performed at energies of at least 5 keV.

8. The method of claim 1, wherein monitoring the milling of the thin layer based on a signature of the probe location indicating that the active layer has been reached comprises:
   establishing voltage potentials on the active layer for voltage contrast imaging; and
   detecting voltage contrast in scanning electron microscope images of the backside of the sample as the milling of the thin layer is performed.

9. The method of claim 1, further comprising:
polishing the backside of the sample after removal of the bulk material; and
Loading the sample into a chamber.

10. A system comprising:
an electron beam column to provide an electron beam;
an ion beam column to provide an ion beam;
one or more detectors; and
a controller coupled to the electron and ion beam columns, the controller configured to:
   locate corner fiducials on a front side of the sample using an infrared imaging system;
   locate a probe area based on coordinates provided by a debug control;
   locate a region outside of the probe area;
   mill an alignment fiducial on the backside of the sample in the region outside of the probe area;
   image the probe area and the alignment fiducial using the infrared system;
   determine an offset between the alignment fiducial and the probe area based on the imaging; and
   locate the probe location based on the offset
   mill, by the ion beam, a thin layer to expose the probe area of the active layer;
   monitor the milling of the thin layer based on a signature of the probe location indicating that the active layer has been reached; and
   terminate, in response to the monitoring, the milling.

11. The system of claim 10, wherein to monitor the milling of the thin layer based on the signature of the probe location indicting that the active layer has been reached further includes the controller configured to:
   detect an image contrast while milling the thin layer, the image contrast indicating the active layer has been reached.

12. The system of claim 11, wherein to detect an image contrast while milling the remaining material from the backside of the sample further includes the controller configured to:
   detect a change in image brightness between components in the probe area formed of silicon oxide and components in the probe area formed of silicon.

13. The system of claim 10, wherein to monitor the milling of the thin layer based on the signature of the probe location indicting that the active layer has been reached further includes the controller configured to:
   detect ion induced light emission from atoms sputtered off the backside, wherein oxygen provides a different light emission than silicon, and wherein oxygen indicates the active layer has been reached.

14. The system of claim 10, wherein to monitor the milling of the thin layer based on the signature of the probe location indicting that the active layer has been reached further includes the controller configured to:
   detect characteristic x-ray signatures to identify material on the surface of the backside, wherein detection of oxygen indicates the active layer has been reached.

15. The system of claim 10, wherein to monitor the milling of the thin layer based on the signature of the probe location indicting that the active layer has been reached further includes the controller configured to:
   detect presence of oxygen atoms in the vacuum chamber using ion mass spectroscopy, wherein the presence of oxygen indicates the active layer has been reached.

16. The system of claim 10, wherein to monitor the milling of the thin layer based on the signature of the probe location indicting that the active layer has been reached further includes the controller configured to:
   alternate between the milling of thin layer and electron-beam imaging of the backside to determine when an underlying pattern of the active layer is within 10 to 100 nm from the surface to calibrate and slow the milling of the thin layer, wherein the electron beam imaging is performed at energies of at least 5 keV.

17. The system of claim 10, wherein to monitor the milling of the thin layer based on the signature of the probe location indicting that the active layer has been reached further includes the controller configured to:
   establish voltage potentials on the active layer for voltage contrast imaging; and
   detect voltage contrast in scanning electron microscope images of the backside of the sample as the milling of the thin layer is performed.

* * * * *

UNITED STATES PATENT AND TRADEMARK OFFICE
CERTIFICATE OF CORRECTION

| | | |
|---|---|---|
| PATENT NO. | : 11,605,525 B2 | Page 1 of 1 |
| APPLICATION NO. | : 17/117696 | |
| DATED | : March 14, 2023 | |
| INVENTOR(S) | : James Vickers | |

It is certified that error appears in the above-identified patent and that said Letters Patent is hereby corrected as shown below:

In the Claims

In Column 12, Claim 1, Line 35, delete "imaging; and" and insert -- imaging; --, therefor.

In Column 13, Claim 10, Line 45, delete "imaging; and" and insert -- imaging; --, therefor.

In Column 13, Claim 10, Line 46, delete "offset" and insert -- offset; --, therefor.

In Column 14, Claim 11, Line 1, delete "indicting" and insert -- indicating --, therefor.

In Column 14, Claim 13, Line 14, delete "indicting" and insert -- indicating --, therefor.

In Column 14, Claim 14, Line 22, delete "indicting" and insert -- indicating --, therefor.

In Column 14, Claim 15, Line 29, delete "indicting" and insert -- indicating --, therefor.

In Column 14, Claim 16, Line 36, delete "indicting" and insert -- indicating --, therefor.

In Column 14, Claim 17, Line 46, delete "indicting" and insert -- indicating --, therefor.

Signed and Sealed this
First Day of April, 2025

Coke Morgan Stewart
*Acting Director of the United States Patent and Trademark Office*